(12) United States Patent  
Nakatsuka et al.

(10) Patent No.: US 6,829,265 B2
(45) Date of Patent: Dec. 7, 2004

(54) SEMICONDUCTOR LASER ARRAY

(75) Inventors: Shinichi Nakatsuka, Hino (JP); Susumu Saito, Hachioji (JP); Junshin Sakamoto, Mito (JP); Kazuo Sakaki, Hitachinaka (JP); Masahide Tokuda, Ome (JP)

(73) Assignees: Hitachi, Ltd., Tokyo (JP); Hitachi Printing Solutions Ltd., Ebina (JP)

( * ) Notice: Subject to any disclaimer, the term of this patent is extended or adjusted under 35 U.S.C. 154(b) by 0 days.

(21) Appl. No.: 10/145,022

(22) Filed: May 15, 2002

(65) Prior Publication Data

US 2002/0172245 A1 Nov. 21, 2002

(30) Foreign Application Priority Data

May 16, 2001 (JP) ......................................... 2001-146375

(51) Int. Cl.[7] ................................................ H01S 3/04
(52) U.S. Cl. ............................ 372/36; 372/43; 438/43; 385/24
(58) Field of Search ........................ 372/36, 43; 438/43; 385/24

(56) References Cited

U.S. PATENT DOCUMENTS 4,977,570 A * 12/1990 Hasegawa ..................... 372/50
5,555,510 A 9/1996 Verseput
5,608,749 A * 3/1997 Kizuki ......................... 372/50
6,052,399 A * 4/2000 Sun ............................. 372/50
6,459,714 B1 * 10/2002 Narui et al. .................. 372/50

OTHER PUBLICATIONS

CLEO/Pacific Rim 2001 WC1–4 (Jul. 15, 2001), "680–nm multi–element laser–diode array for high–speed and high–resolution laser printers".
8th Microoptics Conference MOC'01, Osaka, Japan, Oct. 24–26, 2001—"Multi–element laser–diode array for high–speed, and high–resolution laser printer".

* cited by examiner

Primary Examiner—MinSun Harvey
Assistant Examiner—Cornelius H Jackson
(74) Attorney, Agent, or Firm—Antonelli, Terry, Stout & Kraus, LLP

(57) ABSTRACT

The subject of the disclosed art is to prevent a short circuit between plural electrodes caused by soldering in the assembling process for a semiconductor laser element. The constitution for improving the subject is as follows. A semiconductor laser device comprises a semiconductor laser chip having a first electrode and a laser sustaining material, in which the laser sustaining material has electrodes and solder layers connected electrically therewith on the surface where the semiconductor laser chip is mounted, the first electrode of the semiconductor laser chip is connected with the solder layer of the laser sustaining material and at least the solder layer of the laser sustaining material extends from at least one end face in the longitudinal direction of an optical resonator of the semiconductor laser chip to the outside of the optical resonator.

7 Claims, 8 Drawing Sheets

SEMICONDUCTOR LASER ARRAY

BACKGROUND OF THE INVENTION

The present invention relates to a semiconductor laser element and, more particularly, it relates to a multi-element or array type semiconductor laser device in which a plurality of laser elements is mounted on one substrate.

In conventional semiconductor laser elements, for example, as shown in FIG. 11, plural semiconductor laser portions 16 isolated electrically from each other by an isolation region 4 are formed in an array on the main surface of a semiconductor substrate 2 comprising GaAs and they are mounted on the device mounting region of the main surface of a sub-mount 21 with the main surface of the semiconductor substrate 2 pointing downwardly. On the element-mounting region of the sub-mount 21, plural electrodes 22 are disposed at positions opposite to respective electrodes 10 of the plural light emitting elements of the semiconductor laser elements. A solder layer 24 is then formed on the main surface of each of the plural electrodes 22. That is, the electrodes associated with the semiconductor laser elements are connected electrically mechanically by way of the solder layers 24 to the respective electrodes 22 on the element mounting region of the sub-mount.

On the region other than the element mounting region of the sub-mount, bonding pads 23 for connection with plural bonding wires are formed at such positions that the wires do not shield a laser beam upon attachment of the wires. The end sides of the bonding wires that are disposed to pass through the flanges of device packages are connected to the respective one end sides of a plurality of leads that are electrically isolated from the flanges, whereby the bonding wires can supply electric current to the element from the outside of the element package.

SUMMARY OF THE INVENTION

An object of this invention is to provide a semiconductor laser device with more improved yields in production than heretofore, as well as a manufacturing method thereof.

A specific subject of this invention is to provide a technique capable of preventing a short circuit between electrodes disposed side by side caused by soldering for fixing a semiconductor laser element and capable of improving yields in the assembling process of the array type semiconductor laser elements. The problems are to be explained below.

In the process for assembling the semiconductor laser elements described above, when each of the plural electrodes of the semiconductor laser elements is connected by way of a solder layer to each of plural electrodes disposed on an element mounting region of a sub-mount, a chip is pressed against heated molten solder under a pressure at a predetermined level or more. Therefore, pressure is generated in the molten solder layer. Such pressure is usually balanced with the surface tension of the molten solder at the end of a solder pattern. However, when a disturbing factor such as fine unevenness on the substrate surface or unevenness of solder pattern is present at the end of the solder pattern, the surface tension is weakened at the portion to cause the extrusion of the molten solder. The thus extruded molten solder is brought into contact with adjacent electrodes to cause a short circuit between adjacent electrodes to result in a problem that the yield is lowered in the process for assembling the semiconductor laser elements. In the prior art shown in FIG. 11, no effective countermeasure is taken against the pressure of such molten solder and the solder pattern may possibly be covered completely by the laser chip, so that it is necessary to additionally form a structure for preventing the extrusion of solder between laser stripes. In addition, the extrusion of solder is liable to be formed due to the refinement of the arrangement pitch in the semiconductor laser portion along with a size reduction and an increase of density of the semiconductor laser element and, on the other hand, the provision of the extrusion-preventive structure between the stripes increases the production cost, and occupies an extra area to result in a trouble for refinement.

A feature of this invention resides in a semiconductor laser having a semiconductor laser chip with a first electrode and a laser sustaining material, in which the laser sustaining material has an electrode and a solder layer in electrical connection therewith on a surface where the semiconductor laser chip is mounted, the first electrode of the semiconductor laser chip is connected with the solder layer of the laser sustaining material, and at least the solder layer of the laser sustaining material has a extended portion at the outside of an optical resonator of the semiconductor laser chip, the extended portion extending from at least one end face in the longitudinal direction of the optical resonator.

This invention is particularly effective when applied to a semiconductor laser element in which plural semiconductor laser portions isolated from each other by an isolation region are disposed in an array on a main surface of a semiconductor substrate, and each of plural electrodes is disposed on the main surface of each of the plural semiconductor laser portions, as well as a semiconductor laser device to which the semiconductor laser elements are assembled.

When the semiconductor chip is mounted on the laser sustaining material, the molten solder is guided to the solder layer extending to the outside of the optical resonator and the extrusion of the solder layer to the lateral side thereof can be prevented.

This invention is useful in a multi-element type or array type semiconductor laser device in which multiple elements are mounted on one substrate.

It is also important that the solder layer extending from at least one end face in the longitudinal direction of an optical resonator of the semiconductor laser element to the outside of the optical resonator is disposed so as to avoid the emitting position of a laser beam of the semiconductor laser element.

Furthermore, there may be considered various modes for the solder layer extending from at least one end face in the longitudinal direction of the optical resonator of the semiconductor laser element to the outside of the optical resonator. A typically mode has the extended portion in at least one of the right and left sides relative to the longitudinal direction of the optical resonator of the semiconductor laser element, and the extended portion of the solder layer is present at, at lest one of the front end and the back end of the optical resonator. It is of course possible to provide the extended portion of the semiconductor layer at both the right and left sides relative to the longitudinal direction of the optical resonator, or at both the front end and the back end of the optical resonator.

Further, in a case where the number of the plural semiconductor laser portions arranged in an array is three or more, it is preferred that the semiconductor laser portions excluding the two semiconductor laser portions on both ends of the disposed semiconductor laser portions are constituted in the modes of the invention.

According to the means described above, in the process for assembling the semiconductor laser elements, when each of plural electrodes of the semiconductor laser elements is connected by way of the solder layer to each of plural electrodes disposed on the element mounting region of the sub-mount respectively, since solder discharged by pressing the laser chip is allowed to escape in the extending direction of the stripe, a short circuit between adjacent electrodes can be prevented. As a result, the yield in the process for assembling the semiconductor laser elements can be enhanced.

Further, this invention can provide a semiconductor laser element capable of preventing a short circuit between electrodes caused by extruded solder and capable of improving the yield in the process for assembling the semiconductor laser elements.

BRIEF DESCRIPTION OF THE DRAWINGS

FIG. 2, comprising

DESCRIPTION OF THE PREFERRED EMBODIMENTS

Figure 1:
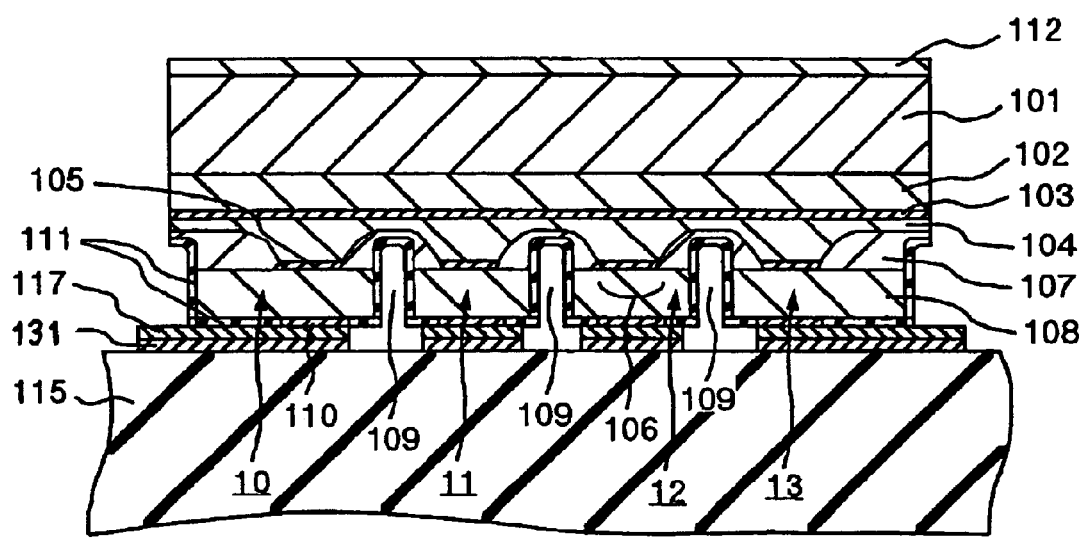
FIG. 1 is a cross sectional view of a semiconductor laser device, taken along a plane crossing the propagating direction of light, according to an embodiment of this invention.
Figure 3:
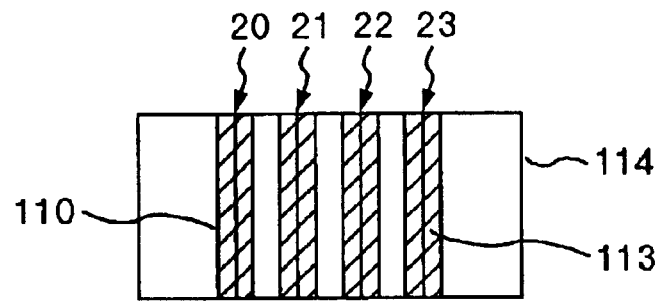
FIG. 3 is a plan view of a principal portion of a semiconductor laser chip according to this invention.
Figure 4:
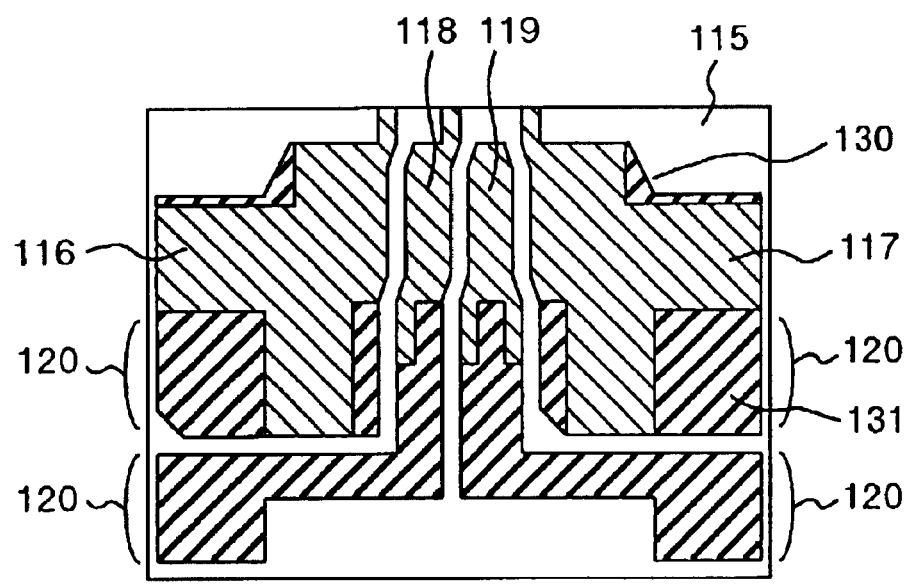
FIG. 4 is a plan view of a sub-mount on which a semiconductor laser chip of this invention is bonded.

FIG. 1 shows a state in which a semiconductor laser chip is mounted in a face-down manner on a chip sustaining material. FIG. 2 is a cross sectional view of a semiconductor laser device of a first embodiment, taken along a plane crossing the propagating direction of light. The chip sustaining material is usually referred to as a sub-mount. FIG. 3 is a plan view of a principal portion of a semiconductor laser chip of the embodiment. FIG. 4 is a plan view of an example of the sustaining material for mounting a semiconductor laser chip of the embodiment.

The main point of this embodiment may be summarized as follows. That is, this embodiment is a multi-element semiconductor laser wherein plural semiconductor lasers isolated from each other by way of an isolation region are arranged in an array on the main surface of a semiconductor substrate, semiconductor laser elements in which electrodes are disposed on their respective main surfaces of the plural semiconductor laser are mounted on the element mounting region of the sub-mount, and the plural electrodes of the elements are each connected only with the corresponding electrode of the sub-mount by way of plural electrodes and solder layers disposed on the element mounting region being isolated from each other by the isolating region. In addition, the semiconductor laser element is characterized in that each of the electrode and the solder layer has a long stripe-shaped structure in the extending direction of the resonator of the semiconductor laser, the length is made longer than the resonator of the semiconductor laser, and the electrode and the solder layer are partially extruded from a position below the semiconductor laser to be connected.

Referring to FIG. 1 and FIG. 2, the constitution of the semiconductor laser element of the first embodiment is to be described.

Figure 2A:
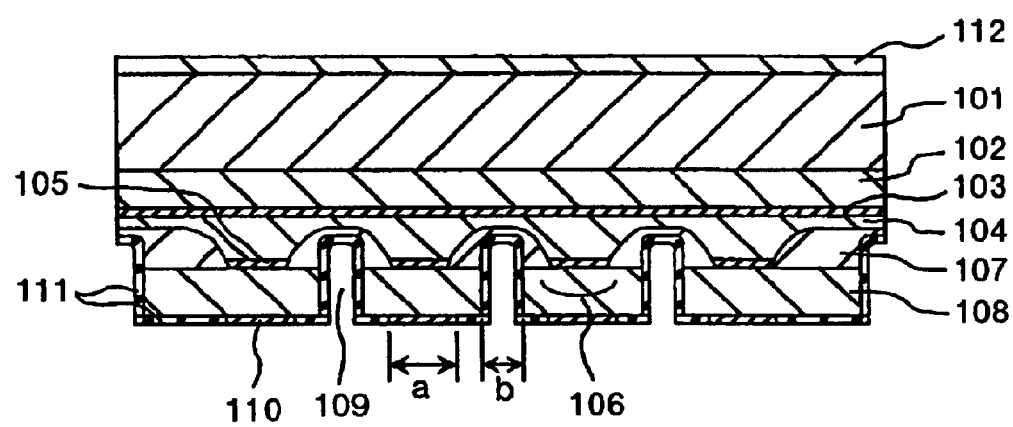
FIGS. 2(a) and 2(b), is a cross sectional view of a semiconductor laser device, upon assembling, according to an embodiment of this invention.

FIG. 2(a) is a cross sectional view of a semiconductor laser device in this embodiment. In the semiconductor laser device of the embodiment, an n-type $(Al_{0.7}Ga_{0.3})_{0.5}In_{0.5}P$ cladding layer (Se doped, $p=1\times10^{18}$ cm$^{-3}$, 1.8 μm) 102, a multi-quantum well structure 103, a p-type $(Al_{0.7}Ga_{0.3})_{0.5}In_{0.5}P$ cladding layer (Zn doped, $p=7\times10^{17}$ cm$^{-3}$, 1.6 μm) 104 and a p-type GaAs cap layer (Zn doped, $p=1\times10^{19}$ cm$^{-3}$, 0.2 μm) 105 of about 0.2 μm in thickness are sequentially grown crystallographically on an n-type GaAs substrate 101 by a customary method.

The multi-quantum well structure 103 comprises three $Ga_{0.5}In_{0.5}P$ well layers (7 nm in thickness) and four $(Al_{0.7}Ga_{0.3})_{0.5}In_{0.5}P$ barrier layers (4 nm in thickness) sandwiching each of the well layers. Detailed illustration for each of the layers is not shown. In the p-type GaAs cap layer 105 and the p-type $(Al_{0.7}Ga_{0.3})_{0.5}In_{0.5}P$ cladding layer 104, the p-type $(Al_{0.7}Ga_{0.3})_{05}In_{0.5}P$ cladding layer 104 is removed chemically while leaving about 0.3 μm in thickness except stripe regions 106 of 4 μm in width using an SiO$_2$ film as a mask. The stripe region 106 is formed in a direction perpendicular to the plane of the drawing (FIG. 2). That is, the stripe region 106 is formed along the propagating direction of laser light. Further, an n-GaAs 107 is selectively grown on both sides of the stripe region 106 by using the SiO$_2$ film as a mask. Then, after removing the SiO$_2$ film, a p-GaAs 108 is grown again to constitute a laser structure of this embodiment.

In this embodiment, as shown in FIG. 1, four laser elements 10, 11, 12 and 13 are formed on a single chip. An isolation trench 109 is then disposed between the respective laser elements. The isolation trench 109 is formed by chemically etching and removing the p-GaAs layer and the n-GaAs layer. A surface gold electrode 110 independent on every element is disposed on the p-GaAs layer 108 isolated by the isolation trenches, and current can be supplied to each of the elements independently. The surface of the semiconductor crystals except for the surface electrodes are covered with a silicon oxide film 111 to protect the surface and prevent a short circuit of the element. The isolation trenches 109 are each formed in a stripe pattern with 30 μm in width while the surface metal electrodes 110 are each formed in a stripe patterns with 70 μm in width.

Then, after grinding the semiconductor wafer at the rear face thereof to 100 μm in thickness by mechanical polishing and chemical etching, a back electrode 112 is disposed on the rear face. The semiconductor wafer formed as described above can be partitioned or divided into laser chips each having 600 μm in width in the direction perpendicular to a laser resonator 113 and 300 μm in length in the longitudinal direction of the laser resonator 113.

FIG. 3 shows a planer view of a principal portion of the laser chip 114, in which four stripe portions 113 each constituting an optical resonator are disposed and surface metal electrodes 110 are each disposed along the stripe portion 113.

Figure 2B:
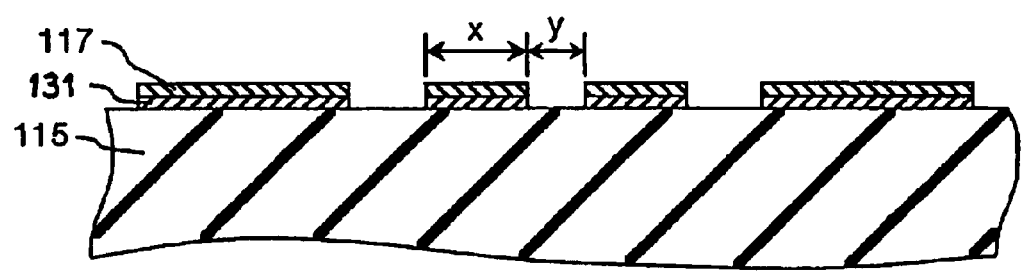

The semiconductor laser chip is bonded to a sustaining material, what is called a sub-mount, with a junction side down configuration. FIG. 1 shows a state after completing assembling and FIG. 2 shows a state before assembling. FIG. 2(a) is a cross section of a laser chip immediately before assembling, which is bonded to the sub-mount of a cross sectional structure as shown in FIG. 2(b). The sub-mount has a planer constitution, for example, as shown in FIG. 4.

An aluminum nitride plate 115 is provided with an electrode 131 of 0.3 μm in thickness mainly made of gold and solder patters 116, 117, 118 and 119 each having 2 μm in thickness, made of a gold and tin alloy. Each of the electrodes is provided with a bonding pad 120. A square portion in a part of the electrode 131 in FIG. 4 is the bonding region. Incidentally, the constitution is identical also in FIG. 5 and FIG. 6. The semiconductor chip is bonded to the sub-mount described above with the junction side pointed downward to assemble a semiconductor laser device. The assembling is conducted, as shown in FIG. 2, by heating the sub-mount to 280° C. to melt the solder 116, 117, 118 and 119, and pressing the bonding face of the semiconductor laser chip 114 to them under a load of 1 g thereon.

Among the solder patterns on the sub-mount, solder patterns 118 and 119 corresponding to the two central laser elements each have a stripe shape substantially parallel with the direction of a resonator 113 of the array-shaped semiconductor laser, and the length in the direction of the resonator is made longer by 40 μm or more than the length of the resonator 113 of the semiconductor laser. Since there is about 15 μm of positional aligning error upon bonding of the laser chip 114, the chip fusing position is determined such that the solder pattern extrudes by from 5 μm to 35 μm, in the direction of the resonator, out of a position below the chip upon bonding.

The resonators other than the central resonators described above (21, 22 in FIG. 3), that is, two resonators disposed at both ends (20, 23 in FIG. 3) have no other resonators on one of right and left sides. Accordingly, since discharged solder can be allowed to escape in the lateral direction with respect to the solder patterns 116 and 117 situated at the ends of the sub-mount, it is not necessary that they adopt a stripe structure. For example, in this embodiment, the solder pattern has a structure that it extends in the lateral direction as shown in FIG. 4. Further, for the convenience of alignment by using the lateral side of chip, an oblique side 130 crossing obliquely with the lateral side of the chip is disposed. The effect of the solder pattern shown in FIG. 4 is to be described later.

The chip mounting position can be aligned exactly by comparing right and left as viewed from the oblique side 130 and the back of the laser chip 114.

Figure 5:
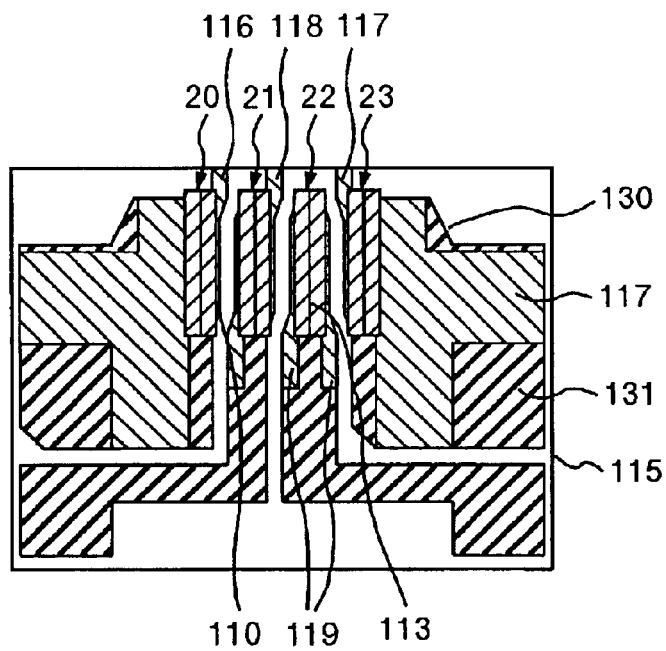
FIG. 5 is a view showing a positional relation between a sub-mount and electrodes of a semiconductor laser chip of this invention.
Figure 6:
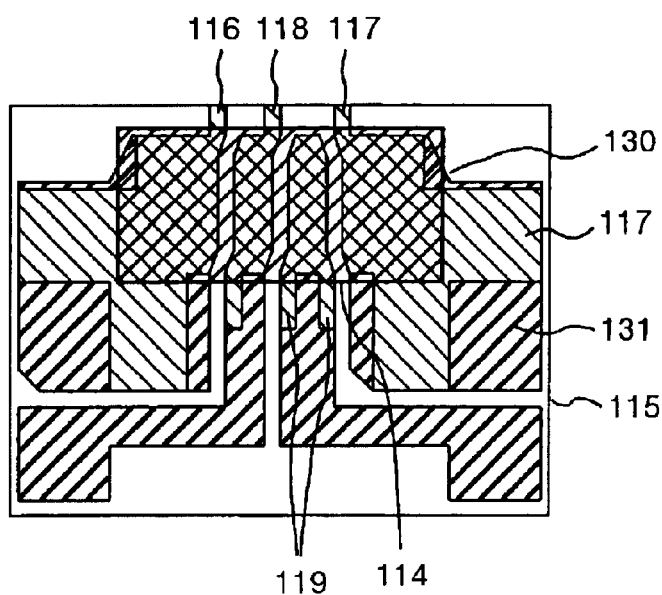
FIG. 6 is a view showing a positional relationship between a sub-mount and a semiconductor laser chip of this invention.

FIG. 5 shows a relation between the solder pattern on the sub-mount and the resonator of the semiconductor laser in this embodiment. The resonators 20, 21, 22 and 23 of four semiconductor lasers correspond to the respective solder patterns. FIG. 6 shows a positional relationship of laser chips corresponding thereto. Referring to FIG. 3 and FIG. 5, this relation will be understood easily.

On the regions other than the element-mounting region of the sub-mount described above, the bonding pads 120 for connection of a plurality of bonding wires are formed at such positions that the wires do not shield the laser light upon attaching the wires. The other end of the bonding wire is provided to pass through a flange of the device package, and is connected to one end of each of a plurality of lead wires separated electrically from the flange, whereby electric current can be supplied from the outside of the package to the elements.

Figure 7:
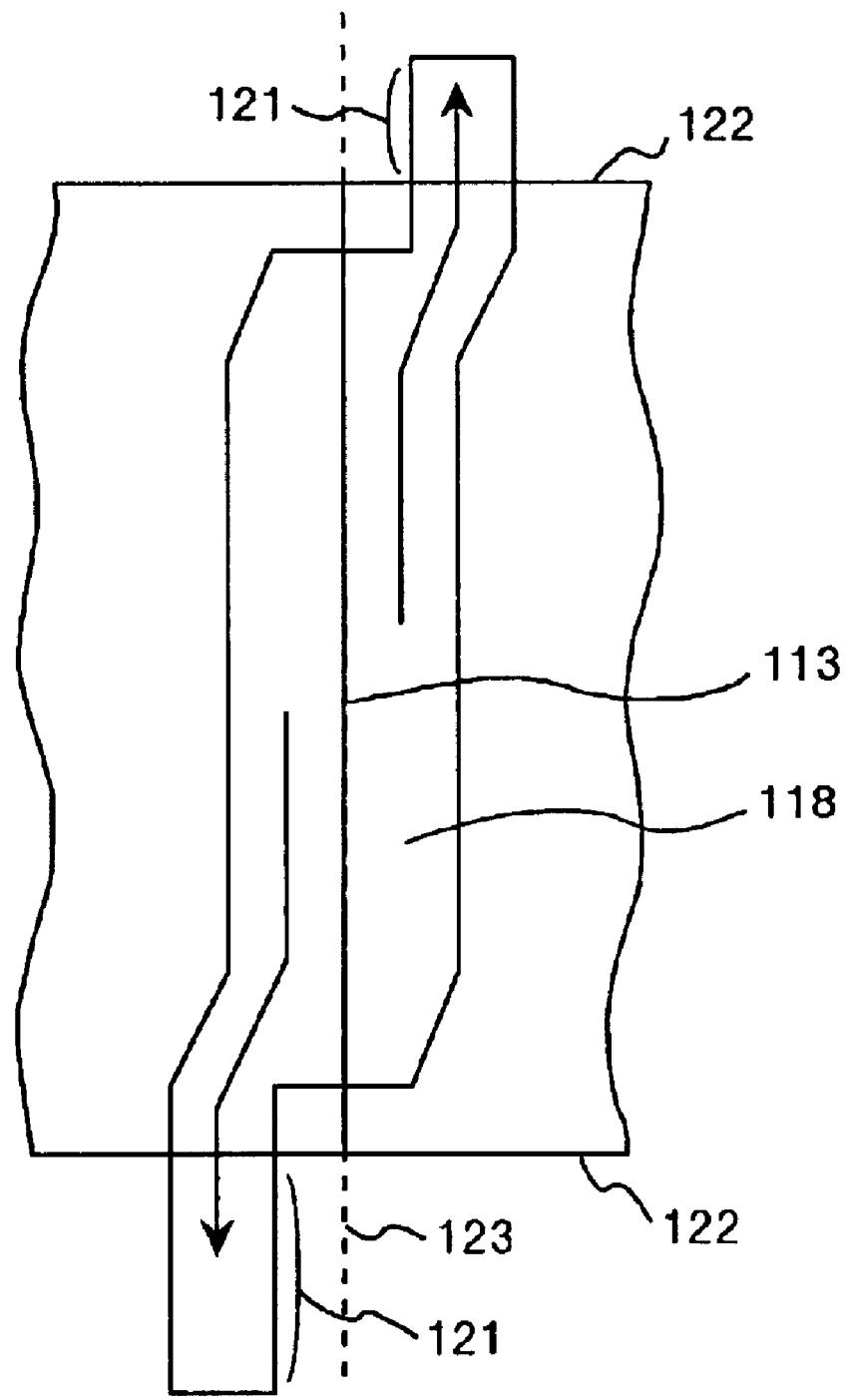
FIG. 7 is a plan view showing an example of a solder pattern of a sub-mount of this invention.
Figure 8:
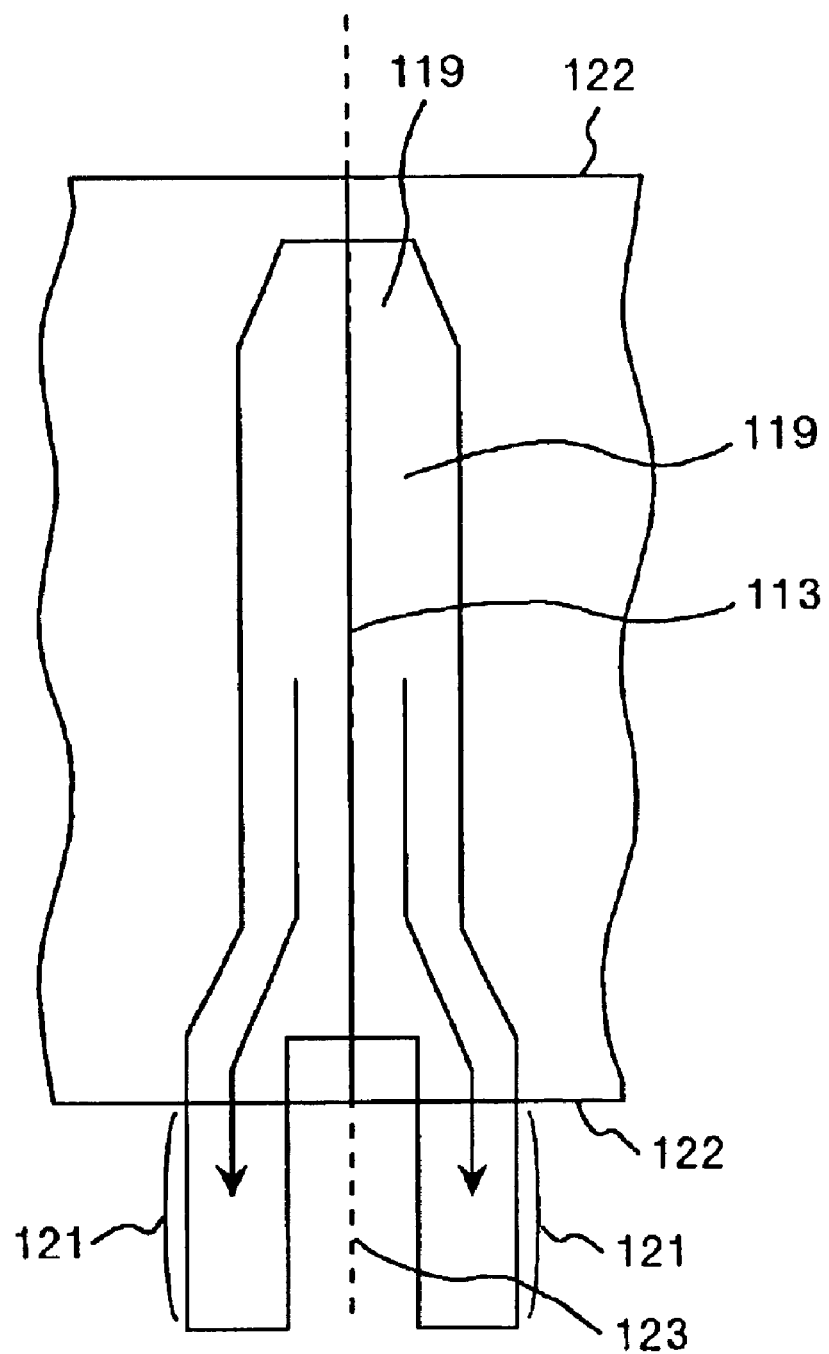
FIG. 8 is a plan view showing another example of a solder pattern of a sub-mount of this invention.

FIG. 7 and FIG. 8 show the details of the positional relation between the electrode and the chip upon bonding the laser chip on the sub-mount shown in FIG. 4. FIG. 7 shows a positional relation of the solder pattern 118 in FIG. 4 and FIG. 8 shows that of the solder pattern 119 in FIG. 4. In each of the figures, are shown semiconductor chip end 122, a laser resonator 113 and its axis 123.

In FIG. 7 and FIG. 8, in order that the laser light is not shielded by the protrusion of solder extruded from a position below the chip upon chip fusion, the pattern 121 of solder extruded from a position below the chip is formed in such a manner as to be offset from the axis 123 of the laser resonator in the vicinity of a bonded position at the chip end face 122. Thus, the solder discharged by a pressure applied to molten solder upon chip bonding is discharged to a position offset from the axis of the resonator, that is, from the region where the laser beam passes. Arrows in FIG. 7 and FIG. 8 each show the flow of the molten solder. The molten solder flows from the area below the chip flows in the region of the solder pattern and gives scarce effect on other portions. In a case where a region in which the solder pattern is offset as described above between adjacent electrodes is disposed, it is effective in sufficiently ensuring the distance between the electrodes to retract the electrode pattern at a portion opposing to the region where the solder pattern of the adjacent electrode is offset, correspondingly.

It is more effective in discharging the solder as has been described above to dispose patterns at the front end face or the back end face of the semiconductor laser for discharging solder on the right and the left sides of the resonator axis respectively. The arrangement of the patterns includes a case where discharge patterns on the right and left sides are disposed at the front and the back, respectively, of the laser element as shown in FIG. 7 and a case where both of right and left side patterns are disposed in one identical direction of the element as shown in FIG. 8. It is effective in saving the refined sub-mount area of the pattern to use such patterns in combination conforming the requirement of the array.

Provision of the semiconductor discharge patterns corresponding to the right and left sides of the resonator is particularly important for a semiconductor laser having a shape in which the resonator of the semiconductor laser is protruded as compared with other regions. This is because the solder is liable to flow to a space between the sub-mount and the semiconductor laser chip and inhibit the light-emitting region on the end face of the laser resonator.

Figure 9:
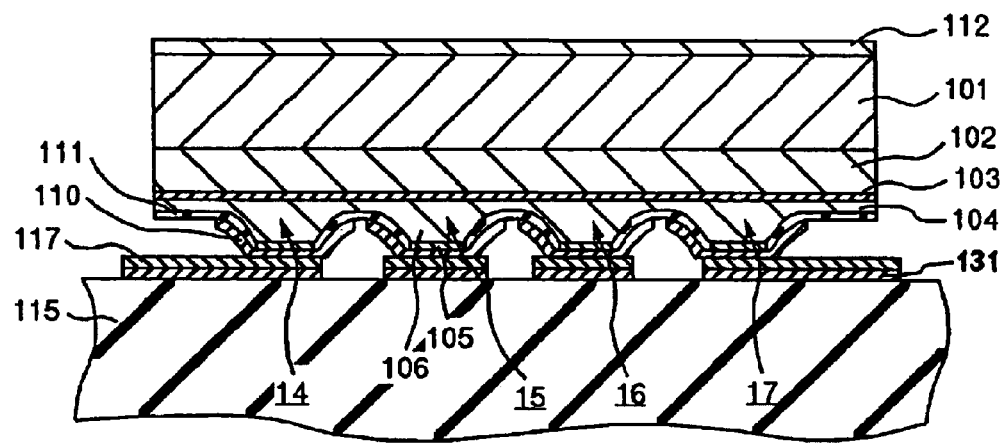
FIG. 9 is a cross sectional view of a semiconductor laser device, taken along a plane crossing the propagating direction of light, according to a second embodiment of this invention.

FIG. 9 is a cross sectional view of a semiconductor laser device as a second embodiment showing an example of a structure in which a central portion is protruded. In this structure, an n-type $(Al_{0.7}Ga_{0.3})_{0.5}In_{0.5}P$ cladding layer (Se doped, $p=1\times10^{18}$ cm$^{-3}$, 1.8 μm) 102, a multi-quantum well structure 103, a p-type $(Al_{0.7}Ga_{0.3})_{0.5}In_{0.5}P$ cladding layer (Zn doped, $p=7\times10^{17}$ cm$^{-3}$, 1.6 μm) 104 and a p-type GaAs cap layer (Zn doped, $p=1\times10^{19}$ cm$^{-3}$, 0.2 μm) 105 of about 0.2 μm in thickness are successively grown crystallographically on an n-type GaAs substrate 101. The multi-quantum well structure comprises three $Ga_{0.5}In_{0.5}P$ well layers (7 nm in thickness) and four $(Al_{0.7}Ga_{0.3})_{0.5}In_{0.5}P$ barrier layers (4 nm in thickness) sandwiching them.

In the thus formed semiconductor laminated body, the p-GaAs cap layer 105 and the p-type $Al_{0.7}Ga_{0.3})_{0.5}In_{0.5}P$ cladding layer 104 are chemically removed by leaving the p-type $(Al_{0.7}Ga_{0.3})_{0.5}In_{0.5}P$ cladding layer 104 by about 0.3 $\mu$m in thickness using an $SiO_2$ film as a mask while leaving a stripe regions 106 of 3 $\mu$m in width to prepare a ridge structure. The axis of the stripe region is in the direction crossing the plane of the drawing (FIG. 9) in the same manner as in the previous embodiment. A silicon oxide film 111 is then deposited as a passivation film except the upper surface of the ridge structure. The ridge-shape laser elements are formed by four elements (14, 15, 16 and 17) described above on a single chip, and gold electrodes 110 isolated electrically from each other are disposed on the respective laser elements.

The substrate of the thus prepared semiconductor laser is ground from the rear face thereof to a thickness of 100 $\mu$m by mechanical polishing and chemical etching and then the back electrode 112 is disposed. Then, it is partitioned into 600 $\mu$m in width in the direction perpendicular to the laser resonator 113 and 300 $\mu$m in length in the identical direction with the laser generator 113. The planer constitution of the laser chip 114 is identical with that shown in FIG. 2.

Electrodes and a solder pattern for bonding the elements of the sub-mount are provided with a pattern on the front end face or the back end face of the semiconductor laser for discharging the solder on the left and right sides of the resonator axis. Since either side of the solder, which is divided into right and left sides by the laser stripe protruded in a ridged shape is not confined below the laser chip and the solder discharging places are ensured, accidental extrusion of solder can be prevented and yield in the element assembling step can be improved significantly.

Next, a description is to be made of the present status of the distance between the array type semiconductor laser element portions and the size of the semiconductor laser electrode and the solder pattern to which this invention is applicable.

It is assumed here that the widths of the stripe electrode and the isolation trench of the semiconductor laser are a and b, respectively, and the widths of the semiconductor pattern and the isolation trench on the sub-mount are x and y respectively. FIG. 2 shows each of the widths. It is considered that the following relation is necessary for a, b, x and y.

Since the array pitch d is identical between the laser chip and the sub-mount, the following relation is obtained:

$$a+b=x+y=d \quad \text{(relation 1)}$$

Since the error of the cleaving position in the semiconductor laser and the error of positional alignment upon assembling are each about 10 $\mu$m, the following equation is established in order not to cause a short-circuit with respect to the adjacent semiconductor patterns even when the aligning position is offset by 25 $\mu$m while taking 5 $\mu$m in margin:

$$a/2+25 \leq x/2+y \quad \text{(relation 2)}$$

Assuming that the width of the stripe of the semiconductor laser is 5 $\mu$m at the maximum, in order that the stripe does not go beyond the region of the semiconductor solder pattern even if the semiconductor laser is assembled with the stripe being offset by 20 $\mu$m, the following relation is necessary:

$$x/2 \geq 22.5 \quad \text{(relation 3)}$$

The thickness for the solder should be 2 $\mu$m or more in order to obtain uniform bonding. However, if it exceeds 5 $\mu$m, the amount of solder extruded from an area below the laser becomes excessive to produce a possibility that a portion of the laser light is shielded or reflected at random by the extruded solder even when the invention is adopted. Accordingly, the optimal range of the thickness of the solder is from 2 $\mu$m to 5 $\mu$m. To form the pattern with good reproducibility on the solder of such thickness, it is considered that the distance between the adjacent solder patterns should be 5 $\mu$m or more. Accordingly, the following relation is established.

$$y \geq 5 \quad \text{(relation 4)}$$

In view of the relation 3 and relation 4, this invention is applicable to the array elements with the array distance up to 50 $\mu$m and then the width of the electrode of the semiconductor laser has the following relation.

$$a \leq d+y-50 \quad \text{(relation 5)}$$

In this embodiment, while two solder patterns are illustrated but it will be apparent that any other modes may be adopted so long as it is within the scope of the invention.

The effects obtained according to this invention are briefly explained as below.

In the semiconductor laser device in which the semiconductor laser elements are incorporated, a short circuit between the electrodes caused by soldering can be prevented to improve the yield in the assembling process.

Further, this invention can provide a semiconductor laser element capable of preventing a short circuit and improving the yield in the assembling process of the semiconductor laser device.

Figure 10:
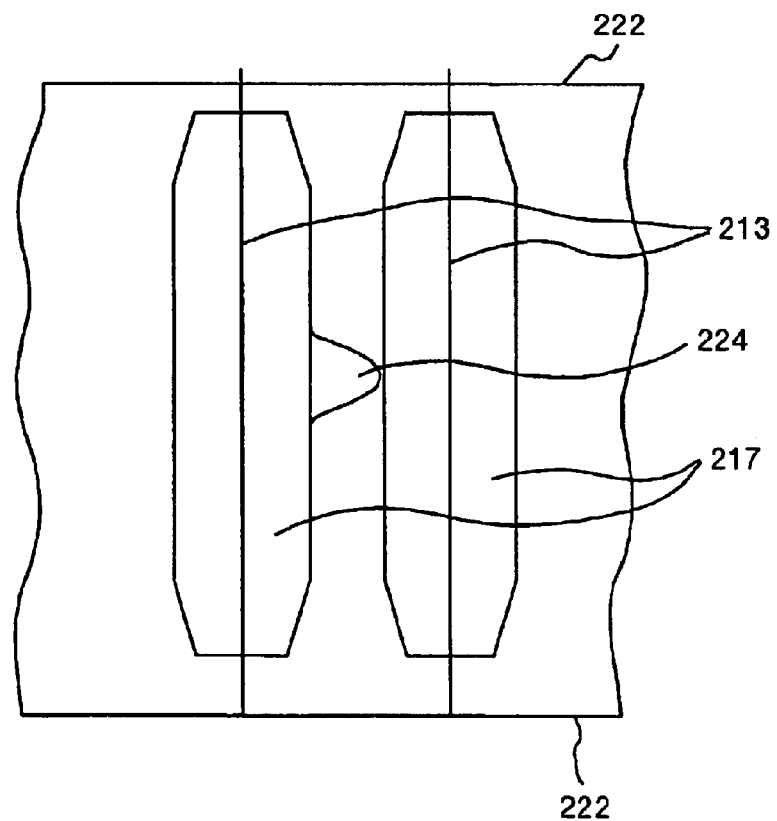
FIG. 10 is a plan view showing an example of the conventional solder pattern for bonding semiconductor laser device.
Figure 11:
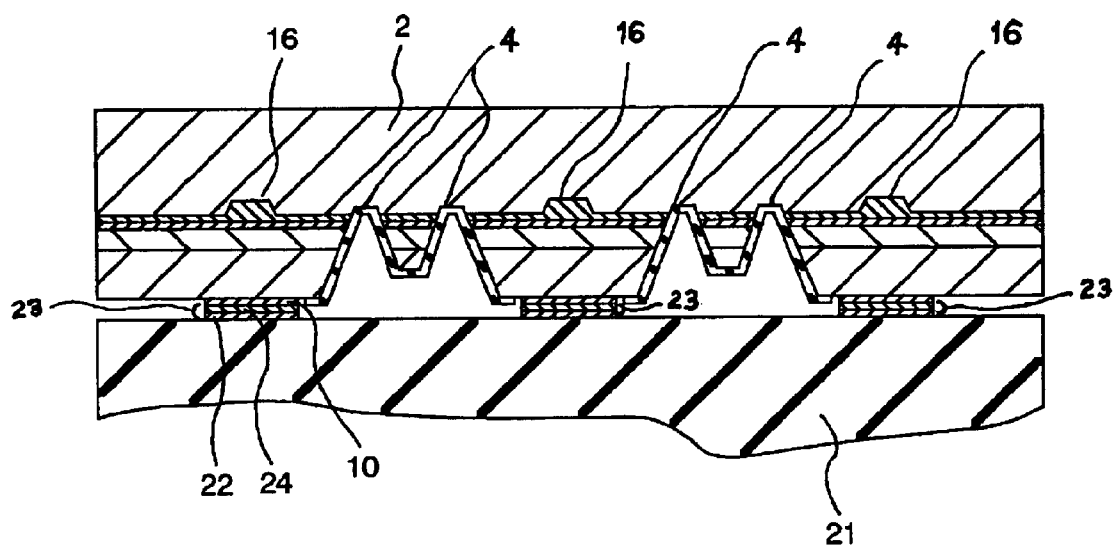
FIG. 11 is a view showing a conventional array-type semiconductor laser elements.

FIG. 10 illustrates a plan view of a conventional solder pattern for comparison with this invention, which shows the relation between solder patterns 217 and the axes 213 of laser resonators. In the figure, are shown end faces 222 of a laser chip and an accidental extruded portion 224 of the solder. In a case where an electrode or a solder layer of a semiconductor laser element has no region larger than semiconductor laser chip as in this invention, a disadvantage occurs that two solder patterns 217 arranged side by side should be in electric contact with each other by the accidental solder extrusion portion 224.

This invention can provide a semiconductor laser device capable of production at a high yield.

What is claimed is:

1. A semiconductor laser device comprising:
    a semiconductor laser chip having a first electrode and an optical resonator which has a longitudinal axis extending in a first direction, wherein said optical resonator includes an emitting portion to emit laser light in said first direction parallel to said longitudinal axis;
    a laser sustaining material having an electrode on a surface thereof where said semiconductor laser chip is mounted;
    a solder layer in electrical connection with the electrode formed on said laser sustaining material;
    wherein the first electrode of said semiconductor laser chip is connected with said solder layer of said laser sustaining material, and wherein at least said solder layer of said laser sustaining material has a extended portion that extends from at least one end face of the semiconductor laser device in the first direction of the optical resonator to the outside of the optical resonator of said semiconductor laser chip, wherein the solder layer that extends from at least one end face of the semiconductor laser device in the first direction to the outside of the optical resonator is bent in a direction leading away from said longitudinal axis so that said extended portion is offset in a lateral direction from said longitudinal axis so as to avoid interfering with said laser light emitted from said emitting position.

2. A semiconductor laser device as defined in claim 1, wherein the solder layer that extends from at least one end face of the semiconductor device in the first direction to the outside of the optical resonator has the extended portion at, at least one of a right side and a left side relative to the longitudinal axis of the optical resonator of the semiconductor laser element, and wherein the extended portion of the solder layer is present at, at least one of a front end and a back end of the optical resonator.

3. A semiconductor laser device comprising:

plural semiconductor laser portions isolated from each other by isolation regions and arranged in an array on a main surface of a semiconductor substrate, semiconductor laser elements including respective electrodes disposed on surfaces of respective semiconductor laser portions and which are mounted on an element mounting region comprised of a laser sustaining material, said semiconductor laser element being connected by way of plural electrodes and solder layers disposed to be isolated from each other by isolation regions on the element mounting region with the electrodes of the laser sustaining material to which plural electrodes of the semiconductor laser electrodes correspond respectively, and at least one solder layer in a stripe shape in an extending direction of an optical resonator of a corresponding one of the semiconductor laser elements and having a portion that extends from at least one end face of the semiconductor laser device in a direction of a longitudinal axis of the optical resonator of the corresponding semiconductor laser element to the outside of the optical resonator, wherein said optical resonator includes an emitting portion to emit laser light in said direction of said longitudinal axis, and wherein the solder layer that extends from at least one end face of the semiconductor laser device in the direction of the longitudinal axis of the optical resonator of the semiconductor laser element to the outside of the optical resonator is bent in a direction leading away from said longitudinal axis so that said extended portion is offset in a lateral direction from said longitudinal axis so as to avoid interfering with said laser light emitted from said emitting position.

4. A semiconductor laser device as defined in claim 3, wherein the solder layer that extends from at least one end face of the semiconductor device in the direction of the axis of the optical resonator of the semiconductor laser element to the outside of the optical resonator has the extending portion at, at least one of right and left sides relative to the longitudinal axis of the optical resonator of the semiconductor laser element, and the extending portion of the solder layer is present at, at least one a the front end and a back end of the optical resonator.

5. A semiconductor laser device, wherein a number of the plural semiconductor laser portions arranged in an array is three or more and a semiconductor laser portion excluding the two semiconductor portions disposed on both ends of semiconductor laser portion are comprised of one of the semiconductor laser elements defined in claim 3.

6. A semiconductor laser device comprising:

a semiconductor laser chip having a first electrode and an optical resonator which has a longitudinal axis extending in a first direction, wherein said optical resonator includes an emitting portion to emit laser light in said first direction parallel to said longitudinal axis;

a laser sustaining material having an electrode on a surface thereof where said semiconductor laser chip is mounted; and a solder layer in electrical connection with the electrode formed on said laser sustaining material;

wherein the first electrode of said semiconductor laser chip is connected with said solder layer of said laser sustaining material, and means for preventing extrusion of the solder layer to a lateral side of the optical resonator and for providing a path for extrusion of said solder layer in said first direction to a location outside of said optical resonator of the semiconductor laser chip when said semiconductor laser chip is being joined to said laser sustaining material by said solder layer, wherein said means comprises an extended portion of the solder layer extending from at least one end face of the semiconductor laser device and bent in a direction leading away from aid longitudinal axis so that said extended portion is offset in a lateral direction from said longitudinal axis so as to avoid interfering with said laser light emitted from said emitting portion.

7. A semiconductor laser device comprising:

a semiconductor substrate;

a semiconductor laser chip that includes plural laser emitting portions which are formed on said semiconductor substrate;

a guiding structure formed for each of the plural laser emitting portions for guiding laser light in a direction parallel to a face of said semiconductor substrate, the guiding structure having a stripe like shape terminated by a pair of mirror end facets that are formed by semiconductor cleavage;

a submount that supports said semiconductor laser chip; and plural stripe shaped electrodes formed on a surface of said submount;

wherein each of the laser emitting portions comprises:

semiconductor laser sustaining material including at least an active layer sandwiched between cladding layers with different conductively types from each other which generates gain for laser light by electric current injection and which guide laser light around said active layer, a first electrode on a surface of the semiconductor laser sustaining material, a second electrode on a back surface of said semiconductor substrate, each laser emitting portion being able to be driven by electric current between the first and the second electrode, wherein said guiding structure and the pair of mirror end facets form an optical resonator toward the first direction that is parallel to a longitudinal axes of the stripe and wherein laser beams are emitted along a line extended from the longitudinal axes, wherein said plural stripe shaped electrodes each have the same pitch as that between the first electrodes of said semiconductor laser sustaining material, wherein said semiconductor laser chip is mounted face down on the submount and fixed to the submount by a solder layer formed on said stripe shaped electrodes formed on the surface of said submount, wherein at least said solder layer of said submount includes an extended portion that extends from at least one face of said semiconductor laser chip in the first direction of the optical resonator to outside of an area covered by said semiconductor laser chip, and wherein the solder layer that extends from at least one of said end facets of said semiconductor laser chip in the first direction to outside of the optical resonator in disposed so as to located away from an end facet of said light emitting portion and an extended line of the longitudinal axes of the stripe shaped waveguide to avoid shading laser light emitted from said laser emitting portion by bending and/or narrowing the solder pattern in a surface plane of said submount.

* * * * *